United States Patent [19]

Mazin

[11] Patent Number: 4,599,704
[45] Date of Patent: Jul. 8, 1986

[54] READ ONLY MEMORY CIRCUIT
[75] Inventor: Moshe Mazin, Andover, Mass.
[73] Assignee: Raytheon Company, Lexington, Mass.
[21] Appl. No.: 567,842
[22] Filed: Jan. 3, 1984
[51] Int. Cl.[4] .............................................. G11C 17/00
[52] U.S. Cl. .................................... 365/104; 365/184
[58] Field of Search .................. 365/94, 104, 103, 184

[56] References Cited

U.S. PATENT DOCUMENTS

| | | | |
|---|---|---|---|
| 4,207,585 | 6/1980 | Rao | 365/104 X |
| 4,327,424 | 4/1982 | Wu | 365/104 |

OTHER PUBLICATIONS

D. R. Wilson et al., "A 100ns 150mW 64Kbit ROM", 1978 IEEE International Solid-State Circuits Conference, Feb. 16, 1978, pp. 152-153, and 273.
1980 IEEE International Solid-State Circuits Conference; pp. 146-147, 270.
"A 256Kbit ROM with Serial ROM Cell Structure"; Roger Cuppens and L. H. M. Sevat; IEEE Journal of Solid-State Circuits, vol. SC-18, No. 3, Jun. 1983, pp. 340-344.

*Primary Examiner*—Joseph A. Popek
*Attorney, Agent, or Firm*—Scott W. McLellan; Philip J. McFarland; Richard M. Sharkansky

[57] ABSTRACT

A non-volatile integrated circuit memory is provided having an array of memory elements selectively programmable to store complimentary binary data, each one of such memory elements being formed in a different region of the integrated circuit and having an address terminal, an output terminal, a ground terminal, and a power supply terminal. Those memory cells programmed into a first logical state are provided with transistor action between the output terminal and the power supply terminal and are inhibited from having transistor action between the output terminal and the ground terminal. Conversely, those memory cells programmed to store the complementary logic state are inhibited from having transistor action between the output terminal and the power supply terminal and are provided with transistor action between the ground terminal and the output terminal. In either programmed state, the transistor action is controlled by signals fed to the address terminal of the cells. With such arrangement, since transistor action is prevented between the power supply terminal and the ground terminal of each cell, an electrical open-circuit is always present to the power supply with the result that a precharge cycle is not required during memory addressing to reduce power. The elimination of such pre-charge cycle thereby eliminates the time delays inherent with the precharge cycle circuitry to thereby increase the operating speed of the memory and, further, the elimination of the circuitry increases the storage capacity of the ROM by making more chip area available for memory cells.

5 Claims, 4 Drawing Figures

READ ONLY MEMORY CIRCUIT

BACKGROUND OF THE INVENTION

This invention relates generally to read only memory (ROM) circutis and, more particularly, to metal oxide semiconductor (MOS) field effect transistor (FET) read only memory cells used in such circuits.

As is known in the art, ROM circuits include a plurality of ROM cells typically arranged in a matrix of rows and columns, each row of cells storing a word of binary data, each bit of the binary data being stored by each one of the column-arranged cells in the row. The binary data is stored by programming the array of cells with selected ones thereof having "transistor action", while the remaining cells are not formed with such "transistor action". The presence or absence of transistor action in a cell corresponds to a logical 1 or logical 0 condition, respectively, thus enabling the cell to be programmed into either a logical 1 or a logical 0 state, respectively. As described in *MOS/LSI Design and Application*, by Dr. William N. Carr and Dr. Jack P. Mize, published by McGraw-Hill Book Company (1972), beginning on page 196, by selective masking, during the fabrication process the array of MOS FET cells, those selected cells which are to have "transistor action" are provided with gate oxides of standard gate oxide thicknesses, whereas those cells where there is to be no "transistor action", are provided with excessively large gate oxide thicknesses. It is noted, however, that the formation, or non-formation, of transistor action can be accomplished by a variety of other techniques, such as, for example, active area removal or ion implantation into the unwanted transistor region to raise the transistor's voltage threshhold level required for inhibiting current conduction.

As is also known in the art, one type of MOS ROM array includes n-channel MOS transistors with: grounded source contact; gate electrodes of each row of transistors connected to a corresponding row of electrical conductors (i.e., a word line); and drain contacts of each column of such transistors coupled to an output source amplifier via a corresponding column electrical conductor (i.e., a bit line). A suitable positive voltage supply, such as the drain voltage supply ($V_{DD}$), is electrically coupled to the drain contacts via the bit lines for a short period of time, generally referred to as a pre-charge cycle, in order to reduce power. That is, rather than have the drain contacts remain connected directly to the $+V_{DD}$ supply at all times, a pre-charge cycle is generally provided since, absent the pre-charge cycle, when an address is fed to the word decoder to enable a row of transistors, those cells being programmed with "transistor action" would electrically couple the power supply to ground thereby continually draining power from the supply. With a pre-charge cycle, however, the voltage supply is electrically decoupled from the supply voltage except when the ROM is to be read. More particularly, a ROM which operates with a pre-charge cycle generally includes a transition detector circuit which detects a change in the address fed to the ROM. In response to this address change, the transition detector circuit produces a pulse which electrically connects the drain contacts to the $+V_{DD}$ source during a short time duration with the result that the bit lines, because of the capacitance (C) between the bit lines and the grounded semiconductor substrate, store a charge substantially equal to $Q=CV_{DD}$. Once the bit is charged to $+V_{DD}$ (logical 1), the word, or address, decoder is enabled, (having been disabled during the pre-charge cycle) and a selected row of cells is thus addressed. The n-channel transistors in the addressed row programmed to have "transistor action" will have their respective bit lines discharged towards ground potential (or 0 volts) and hence a logical 0 state will be sensed by the output sense amplifiers connected to these transistor's bit lines. On the other hand, the n-channel transistors in the addressed row not programmed to have "transistor action" will have the bit lines connected to them remain substantially at the $+V_{DD}$ voltage level stored on the bit line in response to the pre-charged pulse. Since, under such condition, there is no electrical path provided through these transistors for discharging the charged bit line to ground potential, a logical 1 will be sensed by the output sense amplifiers connected to the bit lines of these transistors. In either case, however, the voltage source is electrically decoupled from the cells except for the short period of time required during the charge phase of the pre-charge cycle.

Thus, with such arrangement, while the memory is able to store logical data, and while the pre-charge cycle and associated circuitry described above reduces the power requirements of the memory, such pre-charge cycle and associated circuitry reduces the operating speed of the memory and also reduces the storage caoacity of the ROM by reducing the area available on the ROM chip for memory cells.

SUMMARY OF THE INVENTION

In accordance with the present invention, a non-volatile integrated circuit memory is provided having an array of memory elements selectively programmable to store complimentary binary data, each one of such memory elements being formed in a different region of the integrated circuit and having an address terminal, an output terminal, a ground terminal, and a power supply terminal. Those memory cells programmed into a first logical state are provided with transistor action between the output terminal and the power supply terminal and are inhibited from having transistor action between the output terminal and the ground terminal. Conversely, those memory cells programmed to store the complementary logic state are inhibited from having transistor action between the output terminal and the power supply terminal and are provided with transistor action between the ground terminal and the output terminal. In either programmed state, the transistor action is controlled by signals fed to the address terminal of the cells.

In a preferred embodiment of the invention, each one of such memory elements comprising a source region and a drain region, one being coupled to the ground terminal and the other being coupled to the power supply terminal; an intermediate region coupled to the output terminal; and, gate electrodes, coupled to the address terminal and disposed over both the region between the source region and the intermediate region and the region between the intermediate region and the drain region; wherein transistor action is provided between the intermediate region and a selected one of the source and drain regions to thereby selectively program into such cell one of a pair of complementary logic states. When addressed, a ground level detected at the output terminal indicates that the cell has been programmed with transistor action provided between the grounded one of the drain and source regions and the intermediate region and, hence, stores one logical state, whereas a power supply voltage level detected at the output terminal indicates that the cell has been programmed with transistor action being provided between the intermediate region and one of the drain and source regions connected to the power supply terminal and, hence, stores the complementary logic state.

With such arrangement, since transistor action is prevented between the power supply terminal and the ground terminal of each cell, an electrical open-circuit is always present to the power supply with the result that a precharge cycle is not required during memory addressing to reduce power. The elimination of such pre-charge cycle thereby eliminates the time delays inherent with the pre-charge cycle circuitry to thereby increase the operating speed of the memory and, further, the elimination of said circuitry increases the storage capacity of the ROM by making more chip area available for memory cells.

BRIEF DESCRIPTION OF THE DRAWING

The foregoing features of this invention, as well as the invention itself, may be more fully understood from the following detailed description read together with the accompanying drawings in which.

DESCRIPTION OF THE PREFERRED EMBODIMENTS

Figure 1:
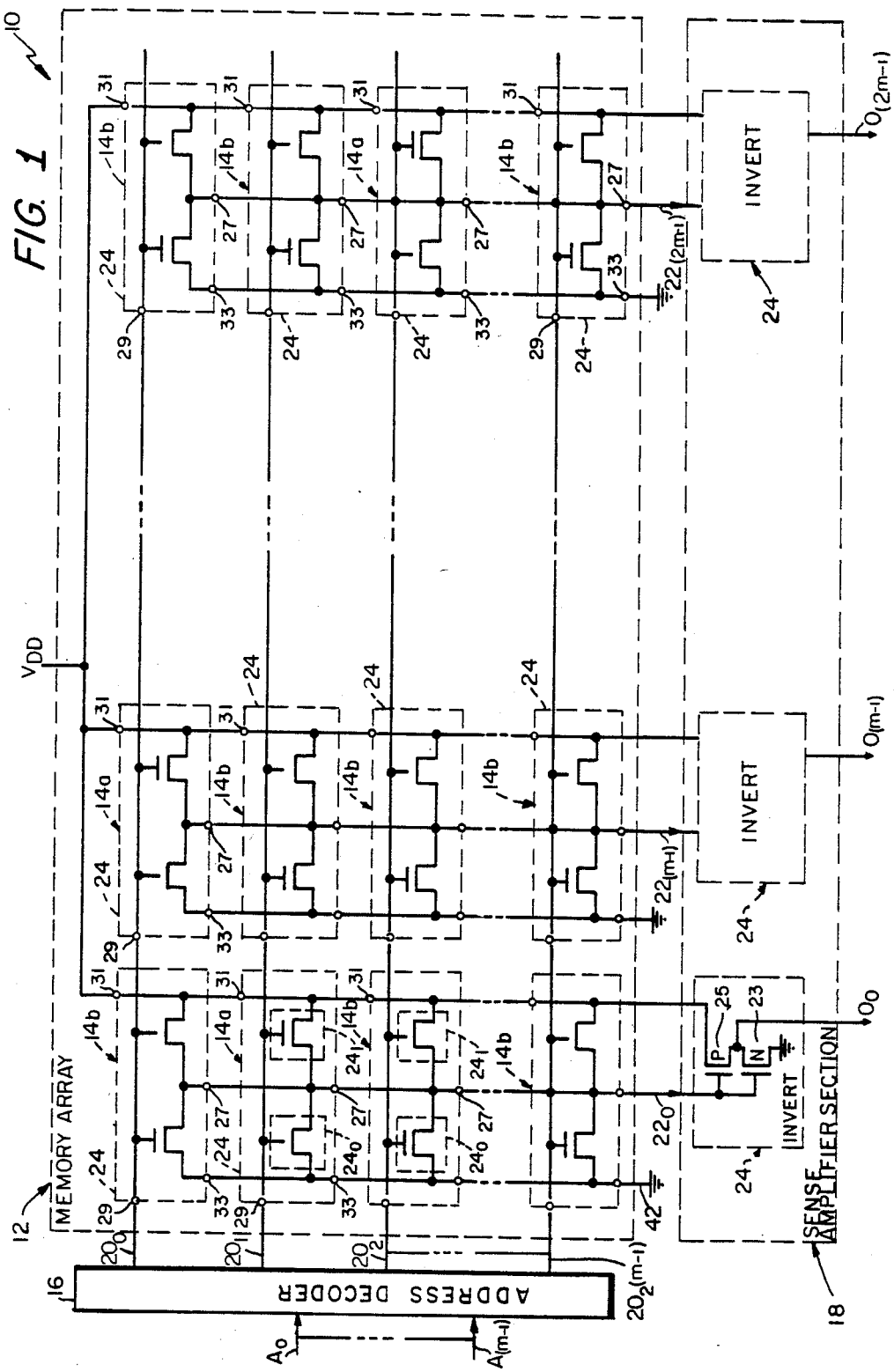
FIG. 1 is a schematic diagram of a read-only memory according to the invention.

Referring now to FIG. 1, an integrated circuit read-only memory (ROM) 10 is shown to include: an array 12 of memory elements $14_a$, $14_b$ arranged in a matrix of rows and columns, as shown (memory elements $14_a$ being programmed to store a logical 1 and memory elements $14_b$ being programmed to store a logical 0); an address decoder 16; and a sense amplifier section 18. The address decoder 16 is of any conventional design and enables, or addresses, a selected one of $2^n$ row conductor, or word lines $20_0$-$20_{(2n-1)}$, selectively in accordance with an n-bit address signal $A_{0-A(n-1)}$ fed to such address decoder 16. Each one of the rows of memory elements $14_a$, $14_b$ is connected to a corresponding one of the word lines $20_0$-$20_{(2n-1)}$ as shown. Binary data stored in the row of memory elements $14_a$, $14_b$ connected to the selected, or enabled, one of the word lines $20_0$-$20_{(2n-1)}$ is fed to the sense amplifier section 18 via m column conductors, or bit lines $22_0$-$22_{(m-1)}$, to thereby read from the ROM 10 the m-bits of the addressed one of the n-words stored in such ROM 10; such n, m-bit digital words having been mask programmed into the ROM 10 during its fabrication as an integrated circuit. Here the sense amplifier section 18 is shown to include a plurality of simple MOS-FET inverter circuits 24, each one thereof being coupled to a corresponding one of the m-bit lines $22_0$-$22_{(m-1)}$ to produce at the output of such sense amplifier section an m-bit digital word $O_0$-$O_{(m-1)}$. (More particularly, each inverter includes an n-channel enhancement MOS FET 23 having a grounded source contact, a gate electrode connected to the bit line coupled to such inverter, and a drain contact connected to the drain contact of a p-channel enhancement mode MOS FET 25. The FET 25 has a source contact connected to $+V_{DD}$ and a gate electrode connected to the bit line, as shown.)

Figure 3:
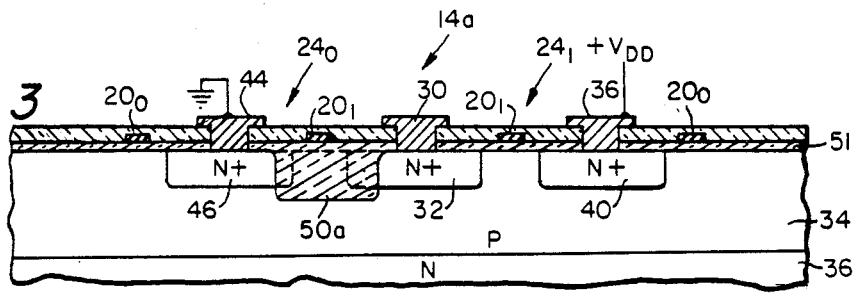
FIG. 3 is a cross-section elevation view taken along line 3—3 of FIG. 2 showing a memory cell of the memory of FIG. 1 programmed to store a logical 1.
Figure 2:
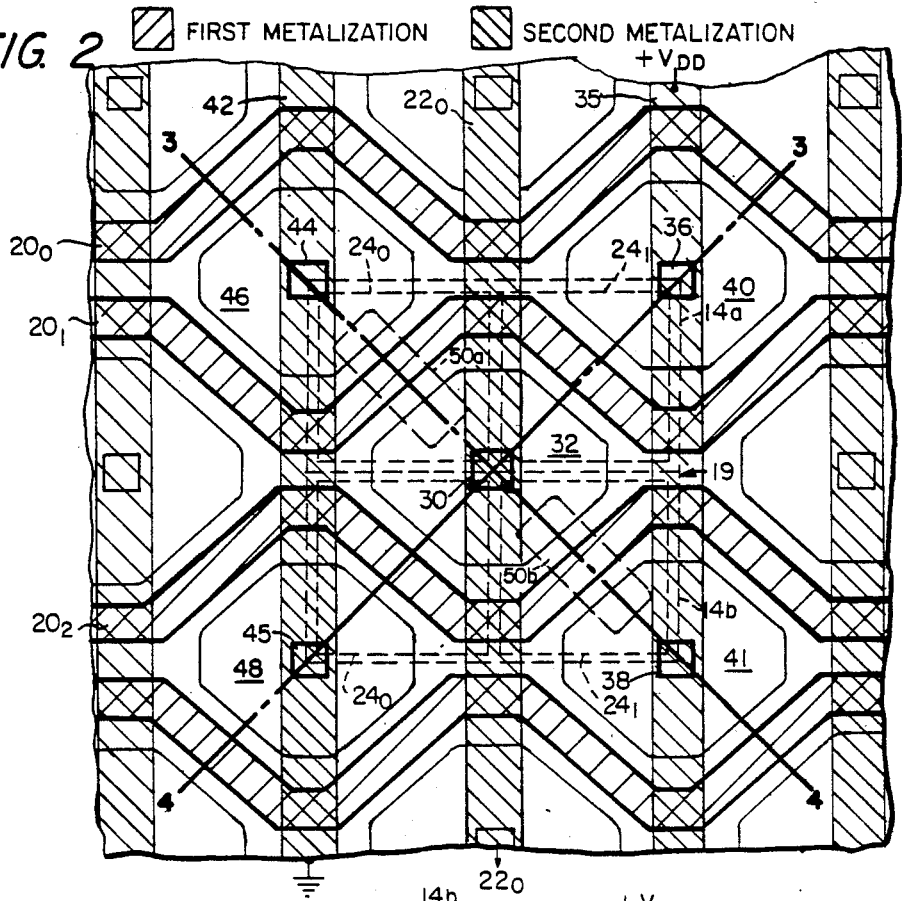
FIG. 2 is a diagrammatical plan view of a portion of the memory array used in the read-only memory shown in FIG. 1.
Figure 4:
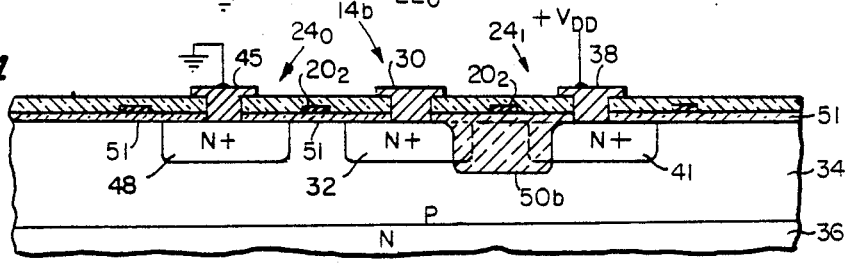
FIG. 4 is a cross-section elevation view taken along line 4—4 of FIG. 2 showing a memory cell of the memory of FIG. 1 programmed to store a logical 0.

Referring now also to FIGS. 2, 3 and 4, it is first noted that the memory elements $14_a$, $14_b$ are formed in different regions 24 of the semiconductor body used to fabricate the ROM 10 as an integrated circuit. It is further noted that each of the different regions 24 includes two subregions $24_0$, $24_1$. During fabrication of the ROM 10 as an integrated circuit, those regions 24 which are programmed to store logical 1 data (i.e., memory elements $14_a$) have formed in the subregion $24_1$ thereof an n-channel enhancement mode metal oxide semiconductor (MOS) field effect transistor (FET) configured in a source follower configuration; that is, with such MOS FET having: its drain contact connected to the one of the bit lines connected to such memory element $24_1$ at an output terminal 27 (FIG. 1); its gate electrode connected to the one of the word lines connected to such memory element $24_1$ at an address terminal 29 (FIG. 1); and, its source contact connected to a positive voltage source $+V_{DD}$ as shown at a power supply terminal 31 (FIG. 1), while transistor action is inhibited in the subregion $24_0$ of such memory element $14_a$, between the output terminal 27 (FIG. 1) and a ground terminal 33 (FIG. 1). On the other hand, those regions 24 which have been programmed to store logical 0 data (i.e., memory cells $14_b$) have formed in the subregion $24_0$ thereof an n-channel enhancement mode MOS FET in a grounded (or common) source configuration; that is, with its gate electrode connected to the one of the word lines connected to such memory element $14_b$ at the address terminal 29 (FIG. 1); its drain contact connected to the one of the bit lines $22_0$-$22_{(m-1)}$ connected to such memory element $14_b$ at the output terminal 27 (FIG. 1); and, the source contact connected to the ground terminal 33 (FIG. 1), while transistor action is inhibited in subregion $24_1$ of such memory element $14_b$ from between the output terminal 27 and the power terminal 31.

Referring in detail to an exemplary pair of memory elements $14_a$, $14_b$, here the memory elements $14_a$, $14_b$, which share bit line $22_0$ and which are connected to address lines $20_1$ and $20_2$, respectively, it is noted that, as shown more clearly in FIG. 2, 3, and 4, the bit line $22_0$ is electrically connected to an electrical contact 30 which is in ohmic contact with an n+ type conductivity region 32, such region 32 being diffused within an p-type conductivity well 34 disposed in an n-type conductivity silicon substrate 36. Referring briefly to FIG. 1, it is noted that contact 30 (FIGS. 2, 3, and 4) provides the output terminals 27 of the exemplary pair of cells $14_a$, $14_b$ coupled bit line 22 (FIG. 1). Contacts 36 and 38 (FIGS. 2, 3, and 4) are in ohmic contact with n+ type conductivity regions 40, 41, such regions being diffused within the well 34. Referring briefly also to FIG. 1, it is noted that electrical contacts 36, 38 provide the power supply terminals 31 for the memory cells and are connected to $+V_{DD}$ via bus 35. The grounded well 34 (FIGS. 2, 3 and 4) is coupled to a ground bus 42 and is electrically connected to contacts 44, 46. The contacts 44, 45 are in ohmic contact with n+ type conductivity regions 46, 48, respectively, as shown, which regions 46, 48 are diffused within the well 34. Referring briefly also to FIG. 1, it is noted that contacts 44, 45 provide ground terminals 33 of the memory cells. Further, it is noted that while the buses 35, 42 and bit line 22 are formed as a second, upper layer of metallzation, a first lower level of insulated metallization, here doped polycrystalline silicon, provides the word lines with portions thereof, providing gate electrodes. Further, it is noted that while the gate electrode of cells $14_a$ is disposed over a thin silicon dioxide insulating layer 51 of silicon dioxide on the portions of the surface of the well 34 between the regions 40 and 32 of cell $14_a$ to provide an n-channel enhancement mode MOS FET subregion $24_1$, here a deep region $50_a$ silicon dioxide insulating material is formed between the regions 32, 46 to destroy any gate channel between such regions 32, 46 and thus inhibit transistor action between regions 32, 46. Thus, the memory cell $14_a$ addressed by word line $20_1$ and connected to bit line $22_0$ has been provided with transistor action between the power supply terminal 31 and the output terminal 27 (FIG. 1) of such cell $14_a$ and has been programmed without transistor action being provided between output terminal 27 and the ground terminal 33 of such cell $14_a$; hence cell $14_a$ has been programmed to store a logical 1 bit of binary data. On the other hand, the memory element $14_b$, addressed by word line $20_2$ and connected to such bit line $22_0$, has been programmed to store a logical 0 bit of binary data because transistor action is inhibited from between n+ type regions 32 and 48, here by a region $50_b$ of deep silicon dioxide insulation material formed within the portion of the well 34 between regions 41, 32, while transistor action is provided between n+ type regions 32, 48 because only a thin gate oxide is provided over the epitaxial layer surface between these regions. To put it another way, while word line $20_1$ is configured as a gate electrode for controlling flow of carriers between region 32 and region 40, here such action is prevented because here silicon dioxide insulating material is formed in region $50_a$ between regions 32 and 46, thus preventing electrical signals on word line $20_1$ from controlling the flow of carriers between region 32 and 46, whereas the signal on line $20_1$ does provide for the control of carriers between regions 32, 40 because the thickness of the oxide layer 51 is proper to enable this transistor action to take place. On the other hand, considering memory element $14_b$ it is noted that a region of insulating silicon dioxide $50_b$ formed between regions 32 and 41 prevents or inhibits the formation of transistor action within region $24_1$ of such memory element $14_b$; however, in region $24_0$ of memory cell $14_b$, transistor action is not prevented between regions 32 and 48 of cell $14_b$ because of the proper thickness of the gate oxide 51 between these regions 32, 48 and thus a control signal on word line $20_2$ will control the flow of carriers between regions 32 and 48 of cell $14_b$. It is here noted that while the use of an oxide deep within the epitaxial layer between source and drain regions to prevent or inhibit transistor action has been described, other conventional techniques can be used to prevent or inhibit such transistor action, such as active area removal or implantation into the channel region to raise the transistor threshhold for conducting current, or creating an excessively thick gate oxide as described in *MOS/LSI Design and Application* referred to above.

Referring more particularly to FIG. 1 and considering the operation of the ROM 10 while referring specifically, by way of example, to enable signals on address lines $20_1$ and $20_2$ and the exemplary pair of memory elements $14_a$, $14_b$ connected to bit line $22_0$, it is first noted that an enable signal on word line $20_1$ places the enhancement mode transistor formed in region $24_1$ of memory element $14_a$ into a conduction condition, thereby coupling a relatively high voltage from the $+V_{DD}$ source to the bit line $22_0$; such voltage coupling the grounded source of transistor 23 onto output line $O_0$ while an enable signal on word line $20_2$ will place the enhancement mode transistor formed in region $24_0$ into a conducting condition coupling the bit line $22_0$ to ground potential, such voltage coupling $V_{DD}$ at the drain of transistor 25 to line $O_0$. It is next noted that when either one of the word lines $20_1$, $22_2$ is enabled, an open circuit condition exists between the power supply $V_{DD}$ and the ground bus 42, thereby reducing the power requirement of the ROM without the use of conventional pre-charge circuitry.

Having described a preferred embodiment of the invention, it will now be apparent to one of skill in the art that other embodiments incorporating its concept may be used. It is believed therefore that this invention should not be restricted to the disclosed embodiment but, rather, should be limited only by the spirit and scope of the appended claims.

What is claimed is:

1. A non-voltaile integrated circuit memory having an array of memory cells, each one of said memory cells in the array of memory cells being formed in a different region of the integrated circuit and being selectively programmable to store complementary binary data, each one of said memory cells comprising: an address terminal, a ground terminal, an output terminal, and a power supply terminal; and wherein a first set of said memory cells programmed into a first logical state is being provided with transistor action between the output terminal and the power supply terminal and being absent of transistor action between the output terminal and the ground terminal, and a second set of memory cells programmed to store the complementary logic state being absent transistor action between the output terminal and the power supply terminal while being provided with transistor action between the ground terminal and the output terminal and wherein, when in either programmed logical state, the transistor action is controlled by signals fed to the address terminal of the memory cells.

2. The memory recited in claim 1 wherein the transistor action is provided by an enhancement mode field effect transistor.

3. A non-volatile integrated circuit memory having an array of memory cells, each one of said memory cells in the array of memory cells being formed in a different region of the integrated circuit and being selectively programmable to store complementary binary data, each one of said memory cells comprising:
   (a) a source region;
   (b) a drain region;
   (c) an intermediate region disposed between the source region and the drain region;
   (d) a gate electrode for controlling transistor action between the intermediate region and a first one of the source and drain regions;
   (e) means for inhibiting transistor action between the intermediate region and a second one of the source and drain regions; and
   (f) wherein the binary data stored in the memory cell is determined by enabling the transistor action between the intermediate and the first one of the source and drain regions while inhibiting transistor action between the intermediate and the second one of the source and drain regions when an enable signal is placed on the gate electrode, and wherein the memory cell is disabled when on enable signal is placed on the gate electrode.

4. A non-volatile integrated circuit memory having an array of memory cells, each one of said memory cells in the array of memory cells being formed in a different region of the integrated circuit and being selectively programmable to store complementary binary data, each one of said memory cells comprising:
   (a) a power supply terminal coupled to a drain region;
   (b) a ground terminal coupled to a source region;
   (c) an output terminal coupled to an intermediate region disposed between the source and drain regions;
   (d) an address terminal coupled to a gate electrode, a first portion thereof being disposed between the drain region and the intermediate region and a second portion thereof being disposed between the intermediate region and the source region; and
   (e) wherein one set of said memory cells includes means for inhibiting the first portion of the gate electrode from controlling the flow of carriers between the drain region and the intermediate region while allowing the second portion of the gate electrode to control the flow of carriers between the intermediate region and the source region and wherein a second set of said memory cells includes means for inhibiting the second portion of the gate electrodes of said memory cells in the second set thereof from controlling the flow of carriers between the source region and the intermediate region while allowing the first portion of the gate electrode to control the flow of carriers between the intermediate region and the drain region.

5. The circuit recited in claim 4 wherein one of the source and drain regions is coupled to a first reference voltage potential and the other one of said regions is coupled to a second reference voltage potential.

* * * * *

UNITED STATES PATENT OFFICE
CERTIFICATE OF CORRECTION

Patent No. 4,599,704　　　　Dated July 8, 1986

Inventor(s) Moshe Mazin

It is certified that error appears in the above-identified patent and that said Letters Patent are hereby corrected as shown below:

Column 7, Line 6: Change "on" to --no--.

Signed and Sealed this

Twenty-fifth Day of November, 1986

*Attest:*

DONALD J. QUIGG

*Attesting Officer*　　　*Commissioner of Patents and Trademarks*